(12) United States Patent
Miyamoto et al.

(10) Patent No.: US 7,923,754 B2
(45) Date of Patent: Apr. 12, 2011

(54) BIPOLAR TRANSISTOR

(75) Inventors: Yasuyuki Miyamoto, Nagareyama (JP); Tohru Yamamoto, Yokohama (JP); Masashi Ishida, Ota-ku (JP)

(73) Assignee: Japan Science and Technology Agency, Saitama (JP)

( * ) Notice: Subject to any disclaimer, the term of this patent is extended or adjusted under 35 U.S.C. 154(b) by 0 days.

(21) Appl. No.: 12/093,950

(22) PCT Filed: Nov. 16, 2006

(86) PCT No.: PCT/JP2006/322875
§ 371 (c)(1), (2), (4) Date: Aug. 6, 2009

(87) PCT Pub. No.: WO2007/058265
PCT Pub. Date: May 24, 2007

(65) Prior Publication Data
US 2009/0302351 A1 Dec. 10, 2009

(30) Foreign Application Priority Data
Nov. 18, 2005 (JP) ................................. 2005-334991

(51) Int. Cl.
*H01L 21/331* (2006.01)
(52) U.S. Cl. ................................ 257/197; 257/E29.188
(58) Field of Classification Search .................. 257/197, 257/198, 565, E29.188
See application file for complete search history.

(56) References Cited

U.S. PATENT DOCUMENTS

| | | | |
|---|---|---|---|
| 5,620,907 A | 4/1997 | Jalali-Farahani et al. | |
| 5,729,033 A * | 3/1998 | Hafizi | 257/198 |
| 6,800,880 B1 * | 10/2004 | Tsai | 257/197 |
| 7,034,379 B2 * | 4/2006 | Swanson et al. | 257/565 |
| 7,476,914 B2 * | 1/2009 | Dokumaci et al. | 257/197 |
| 2003/0098465 A1 * | 5/2003 | Suzumura et al. | 257/197 |
| 2004/0169196 A1 | 9/2004 | Yanagisawa | |
| 2005/0001238 A1 * | 1/2005 | Oue et al. | 257/197 |

(Continued)

FOREIGN PATENT DOCUMENTS

JP 09-181091 A 7/1997

(Continued)

OTHER PUBLICATIONS

Translation of PCT/ISA/237 of PCT/JP2006/322875 with IB338 and IB373.

(Continued)

*Primary Examiner* — Nathan W Ha
(74) *Attorney, Agent, or Firm* — Chen Yoshimura LLP

(57) ABSTRACT

A bipolar transistor (1) comprising a subcollector layer (3), a collector layer (4, 5), a base layer (6) and an emitter layer (7) which are successively built up and having: the subcollector layer (3) formed with a projection (3A) and recesses (3B), an upper part above the projection constituting an intrinsic transistor region (1A) of the bipolar transistor; insulator layer (10) buried between the recesses of the subcollector layer and the collector layer (4); a boundary interface between the subcollector layer and the collector layer held between the insulator layers; the base layer (6) made of a single crystal layer and provided with a base electrode (12) on a region becoming an extrinsic base layer (6B) of the base layer; and the subcollector layer provided with a collector electrode (11). The bipolar transistor has advantages of its emitter made finer in width, a reduced parasitic capacitance between its base and collector and improved high-frequency characteristics.

7 Claims, 6 Drawing Sheets

U.S. PATENT DOCUMENTS

| | | | |
|---|---|---|---|
| 2005/0242373 A1* | 11/2005 | Ahlgren et al. | 257/197 |
| 2006/0163610 A1* | 7/2006 | Sawada | 257/197 |
| 2009/0321788 A1* | 12/2009 | John et al. | 257/197 |

FOREIGN PATENT DOCUMENTS

| | | |
|---|---|---|
| JP | 09-186172 A | 7/1997 |
| JP | 10-056023 A | 2/1998 |
| JP | 11-186279 A | 7/1999 |
| JP | 2000-114270 A | 4/2000 |
| JP | 2000-138228 A | 5/2000 |
| JP | 2004-200423 A | 7/2004 |

OTHER PUBLICATIONS

International Search Report (ISR) for PCT/JP2006/322875 for Examiner consideration, citing U.S. Patent No. 1 and foreign references Nos. 3-6 listed above.

PCT/ISA/237 in PCT/JP2006/322875 and its translation of Section V.

* cited by examiner

FIG.5
(A) 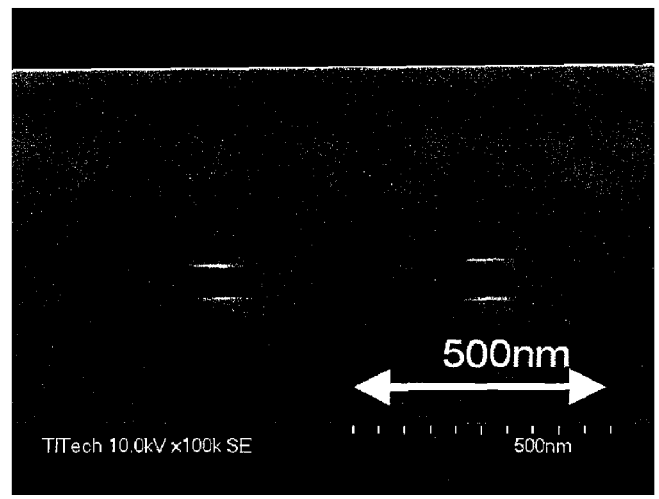
(B) 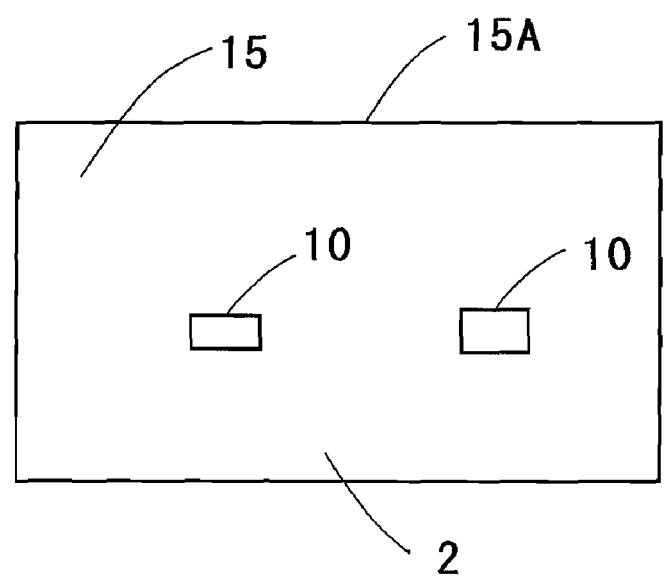

BIPOLAR TRANSISTOR

TECHNICAL FIELD

The present invention relates to a bipolar transistor and a manufacturing method of the same and in particular to a bipolar transistor having its emitter that can be made finer in width, a reduced parasitic capacitance created between its collector and base layer and improved high-frequency characteristics, and a manufacturing method the same.

BACKGROUND ART

A bipolar transistor is formed by fabricating a multilayer structure having a subcollector layer, a collector layer, a base layer and an emitter layer deposited in order and then providing electrodes for the emitter, base and subcollector layers, respectively. While an InP heterojunction bipolar transistor is a fast transistor whose cut-off frequency has been reported to be currently the highest, its fastness depends on increasing the current density by reduction of its size and shortening its transit time. If the emitter width is reduced to excess, however, the parasitic collector capacitance under the base where the base contact is formed becomes not negligible and the transistor contrariwise comes to be slowed down in operating speed.

On the other hand, a silicon bipolar transistor then has an oxide film grown in advance and a contact formed on a polycrystalline extrinsic base layer growing thereon to reduce the parasitic collector capacitance. While the same structure has once been attempted to take in a GaAs heterojunction bipolar transistor, too, it has been the state that the base resistance then cannot be so much reduced by the polycrystalline extrinsic base layer to obtain favorable characteristics.

Patent Reference 1 discloses the structure of GaAs bipolar transistor that the extrinsic base layer is formed of a single crystal and an insulator is provided between the extrinsic base layer and a collector contact layer. FIG. 6 is a cross-sectional view typically illustrating the structure of the conventional bipolar transistor disclosed in Patent Reference 1.

As shown in FIG. 6, the bipolar transistor 50 has a collector contact layer 55 formed on a semiconductor substrate 51 and an insulator layer 59 formed on the collector contact layer 55 wherein the insulator layer 59 is opened in at least two portions. The insulator layer 59 used is lower in dielectric constant than a collector layer 54 and the insulator layer 59 in and above at least one of its opening portions has the collector layer 54, a base layer 53, an emitter layer 52 and an emitter electrode 56 arranged in order, forming a region of intrinsic transistor. The upper face of the base layer 53 is positioned higher than that of the insulator layer 59 and an extrinsic base layer (a region of the base layer other than the intrinsic region) is positioned on the insulator layer 59 and in contact with the adjoining base layer 53. This extrinsic base layer 61 is provided with a base electrode 57 for electrical contact with the base layer 53 and the insulator layer 59 in at least one of its opening portions has a collector electrode 58 in contact with the collector contact layer 55.

Patent Reference 1 mentioned above discloses a process of manufacturing a bipolar transistor 50 which comprises the step of forming a collector contact layer 55 on a semiconductor substrate 51, the step of forming an insulator layer 59 of a selected pattern on the collector contact layer 55, the epitaxial growth step of selectively growing a layer of a collector layer 54 and a base layer 53 in and on the opening portion of the insulator layer 59, the step of epitaxially growing an extrinsic base 61 for connection to a peripheral area of this intrinsic base layer 53 and the step, e.g. of epitaxial growth, of forming an emitter layer 52.

Patent Reference 1: Japanese patent laid open application, JP H11-186279 A

DISCLOSURE OF THE INVENTION

Problems to be Solved by the Invention

To make a bipolar transistor 50 as disclosed in Patent Reference 1, an intrinsic base layer 53 is formed by epitaxial growth and thereafter an extrinsic base layer 61 for connection to the intrinsic base layer 53 must be formed on an insulator layer 59, again, by epitaxial growth. There is the problem, therefore, of requiring the step of epitaxial growth twice and of increasing the process steps in number.

Also, the step of forming the insulator layer 59 is performed after a collector contact layer 55 is grown and then a collector layer 54 that is low in impurity density is grown. Consequently, there is the problem that in the step of growth of the collector layer 54, a good p-n junction cannot be formed due to surface contaminations before and after the growth.

Further, there is the problem that in an InP bipolar transistor giving rise to the best high-frequency characteristics, no attempt has been as yet made at all to reduce the emitter width with the use of such an insulator layer as mentioned above.

With these problems borne in mind, it is a first object of the present invention to provide a bipolar transistor with its emitter that can be made finer in width, a reduced parasitic capacitance created between its collector and base and improved high-frequency characteristics. It is a second object of the invention to provide a manufacturing method of such a bipolar transistor.

Means for Solving the Problems

The present inventors have acquired the knowledge that limiting the width of an insulator layer buried in a compound semiconductor followed by growing thereon a base layer formed of a single crystal compound semiconductor makes it possible both to make the width of an emitter of a bipolar transistor finer and to reduce the parasitic capacitance between the base and the collector, and have arrived at the present invention.

In order to achieve the first object mentioned above, there is provided in accordance with the present invention a bipolar transistor having a subcollector layer, a collector layer, a base layer, and an emitter layer deposited in order, characterized in that: the subcollector layer is formed with a projection and recesses, an upper part above the projection constituting an intrinsic transistor region of the bipolar transistor; an insulator layer is buried between the recesses of the subcollector layer and the collector layer; a boundary interface between the subcollector layer and the collector layer is sandwiched between the insulator layers; the base layer is formed of a single crystal layer and provided with a base electrode on a region becoming an extrinsic base layer of the base layer; and the subcollector layer is provided with a collector electrode.

In the structure mentioned above, the bipolar transistor is preferably a heterojunction bipolar transistor. The heterojunction bipolar transistor preferably comprises a hetero junction constituted by InP and $In_xGa_{1-x}As$ where $0.4 \leq x \leq 0.7$.

The bipolar transistor is preferably formed on a semi-insulating substrate.

According to the aforementioned construction that the subcollector layer is formed with a projection and recesses with the projection providing an intrinsic transistor region, and the insulator layers that are lower in dielectric constant than the semiconductor layers are provided between the recesses and the collector layer, it is possible to markedly reduce the parasitic capacitance created between the extrinsic base layer and the collector layer. Allowing the parasitic capacitance to be much less influenced if the emitter width is made finer, this makes it possible to improve the frequency characteristics of such a bipolar transistor. Further, since the semiconductor extrinsic base layer is formed of the same single crystal layer as the intrinsic base layer, it is possible to reduce the base resistance, to improve the cut-off frequency and the maximum oscillation frequency of a bipolar transistor and to achieve a noise reduction therein.

In order to achieve the second object mentioned above, the present invention also provides a manufacturing method of a bipolar transistor having a subcollector layer, a collector layer, a base layer and an emitter layer, characterized in that it comprises: a first step of forming a subcollector layer on a semiconductor substrate; a second step of forming an insulator layer of a selected pattern in a region becoming an external transistor of the subcollector layer; a third step of epitaxially growing a subcollector layer, a collector layer, a base layer and an emitter layer so as to flatten surfaces of the semiconductor substrate including said insulating layer and said subcollector layer; and a fourth step of forming a base electrode on a region becoming an extrinsic base layer of said base layer.

In the method mention above, the bipolar transistor is preferably a heterojunction bipolar transistor. The heterojunction bipolar transistor preferably comprises a heterojunction constituted by InP and $In_xGa_{1-x}As$ where $0.4 \leq x \leq 0.7$.

The bipolar transistor is preferably formed on a semi-insulating substrate.

According to the manufacturing method features that insulator layer that is lower in dielectric constant than the semiconductor layer is provided on the subcollector layer and the epitaxial growth is effected on a whole surface of the insulator layer and the subcollector layer, it is possible to flatten the collector layer and to bury the insulator layer between the subcollector layer formed with a projection and recesses and the collector layer. Accordingly, it is possible to continuously form the subcollector, the collector layer, and the base layer and the emitter layer in a single process of epitaxial growth. Since in the epitaxial growth layer forming the transistor structure, the n-type subcollector layer which is high in impurity density as formed in advance on the semiconductor substrate is formed first thereon with the n-type subcollector layer which is high in impurity density, contaminations before the growth can be covered with the subcollector layer high in impurity density. Consequently, the influence of contamination can be eliminated. Further, the base layer including the extrinsic base layer can be formed of a single crystal layer.

According to the manufacturing method, the influence of parasitic capacitance can be much reduced when the emitter width is made finer and further since the semiconductor extrinsic base layer is formed of the same single crystal layer as the intrinsic base layer, the base resistance can be reduced. Accordingly, it is possible to make a bipolar transistor with improved high-frequency characteristics which are not lowered if the emitter width is made finer.

EFFECTS OF THE INVENTION

The present invention provides a bipolar transistor in which insulator layer is provided between the subcollector and collector layers and the extrinsic base layer can be formed of the same single crystal as the intrinsic base layer whereby both the parasitic capacitance and the base resistance can be reduced even if the emitter width is made finer.

The present invention provides a manufacturing method of a bipolar transistor whereby the insulator layer formed on the subcollector layer can be formed thereon, in a single step of epitaxial growth, with a bipolar transistor structure including the subcollector layer formed with a projection so as to reduce the capacitance. Therefore, permitting the emitter width to be made finer and both the parasitic collector capacitance and the base resistance to be reduced, the process makes it possible to make with due precision a bipolar transistor with improved high-frequency characteristics.

BRIEF DESCRIPTION OF THE DRAWINGS

In the Drawings:

FIG. 5 illustrates in cross section a semi-insulating substrate immediately after its epitaxial growth in the process of manufacturing in Example wherein (A) is a scanning electron microscopic image and (B) is an explanatory diagrammatic view thereof.

DESCRIPTION OF REFERENCE CHARACTERS

Figure 1:
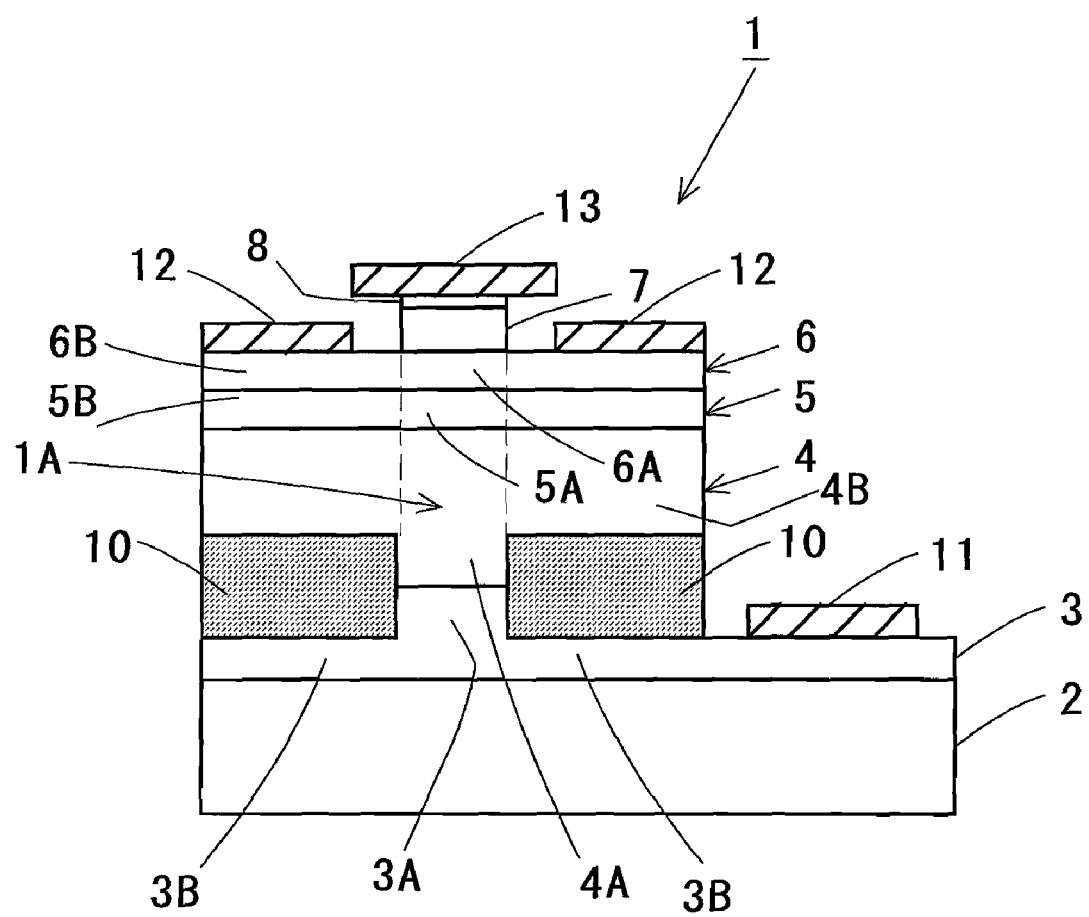
FIG. 1 is a cross-sectional view diagrammatically illustrating a structure of a bipolar transistor according to the present invention.

1: Heterojunction bipolar transistor
1A: Intrinsic bipolar transistor
2: Semi-insulating substrate
3: Subcollector layer
3A: Projection
3B: Recess
4, 5: Collector layer
4A, 5A: Intrinsic collector layer
4B, 5B: Extrinsic collector layer
6: Base layer
6A: Intrinsic base layer
6B: Extrinsic base layer
7: Emitter layer
8: Emitter contact layer
10: Insulator layer
11: Collector electrode
12: Base electrode
13: Emitter electrode
15: Epitaxially grown semiconductor layer

BEST MODES FOR CARRYING OUT THE INVENTION

Explanation is given hereinafter of forms of implementation of the present invention by reference to the Drawing Figures.

Figure 2:
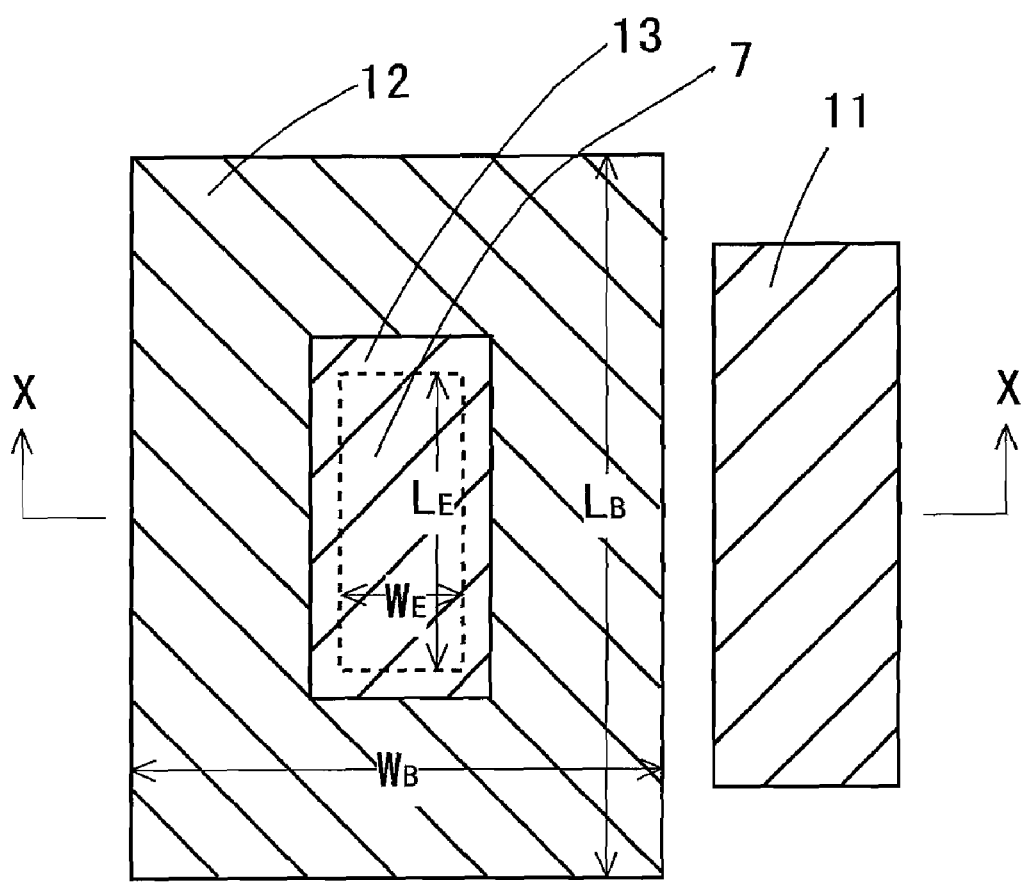
FIG. 2 is a plan view of FIG. 1.

FIG. 1 is a cross-sectional view diagrammatically illustrating a structure of a bipolar transistor according to the present invention and FIG. 2 is a plan view of FIG. 1. A cross section taken along the line X-X in FIG. 2 is that in FIG. 1.

As shown in FIG. 1, the bipolar transistor of the present invention comprises a subcollector layer 3, collector layers 4 and 5, a base layer 6 and an emitter layer 7 which are successively built up on a semiconductor substrate such as a semi-insulating substrate 2.

The subcollector layer 3 formed on the semi-insulating substrate 2 is formed with a projection 3A and a recess 3B. Formed above the projection 3A, parts constituted by collector layers 4A and 6A, a base layer 6A and the emitter layer 7 are designed to constitute an intrinsic bipolar transistor 1A. The collector layers 4A and 6A are the intrinsic collector layers, and the base layer 6A is the intrinsic base layer. Parts above recesses 3B of the subcollector layer 3, i.e. collector and base layers, are designed to constitute extrinsic collector layers 4B and 5B and an extrinsic base layer 6B, respectively.

And, an insulator layer 10 is buried between the recesses 3B of the subcollector layer 3 and the extrinsic collector layer 4B, 5B, and a boundary interface between the projection 3A of the subcollector layer and the collector layer 4, namely the intrinsic collector layer 4A is sandwiched between the two insulator layers 10. In other words, the insulator layer 10 in thickness in the vertical direction in the plane of the sheet is formed thicker than the recess 3B in the step of the subcollector 3. The insulator layer 10 is desirably of a material chosen that is lower in dielectric constant than that of the collector layer 4 or subcollector layer 3. For example, the insulator layer 10 can be of $SiO_2$ having a dielectric constant of 3.9.

Here, the extrinsic base 6B and the emitter layer 7 are provided thereon with a base electrode 12 and an emitter electrode 13, respectively. As shown, the emitter layer 7 may further be provided thereon with an emitter contact layer 8 which is high in impurity density. And, on the semi-insulating substrate 2 the subcollector layer 3 where it is exposed is provided with a collector electrode 11.

As shown in FIG. 2, the base layer 6 has a width and length of $W_B$ and $L_B$, respectively while the emitter layer 7 has a width and length of $W_E$ and $L_E$, respectively.

If in the bipolar transistor 1 shown in FIG. 1, the insulator layer 10 is of $SiO_2$ with a dielectric constant of 3.9 and the collector layer 4 is of InP with a dielectric constant of 12.4, then the parasitic capacitance created between the extrinsic base layer 6B and the subcollector layer 3 of FIG. 1 can be made markedly lower than where there is no such insulator layer 10.

Though later mentioned, it is possible to grow the collector layers 4 and 5, the base layer 6 and the emitter layer 7 continuously on and above the insulator layer 10. To with, the region 6A becoming the intrinsic base and the extrinsic base layer 6B can be formed of a layer of a single crystal. Since this extrinsic base layer 6B that is of a single crystal is more limited in crystal defect than a polycrystalline semiconductor layer, there is less effect of compensation with ionized impurity. Since carrier recombination is then also limited, there can be no deterioration brought about in electric conductivity. Therefore, the bipolar transistor has its cut-off frequency ($f_T$) and maximum oscillation frequency ($f_{MAX}$) raised. Further, since the extrinsic base layer 6B being of a single crystal has less recombination centers produced from crystal defect than a polycrystalline base, its noise characteristics of the device is also improved.

The bipolar transistor 1 of the present invention can make use of a material such as of InP family, GaN family or GaAs family.

Also, the base layer 6 can be made so as to provide a heterojunction for the emitter layer 7. In this case, the bipolar transistor 1 of the present invention becomes a heterojunction bipolar transistor.

To constitute a heterojunction bipolar transistor made of InP and InGaAs as the bipolar transistor of the present invention, the semi-insulating substrate 2 can be formed of InP, the subcollector layer 3 of two layers: n-type InP and InGaAs layers, the collector layers 4 and 5 of InP and InGaAs layers not incorporating any intentional impurity, the base layer 6 of InGaAs of p type and the emitter layer 7 of InP of n type. Also, the emitter layer 7 may be provided thereon with an $n^+$ InGaAs layer as the $n^+$ contact layer 8 high in impurity density.

Here, the InGaAs layer is a semiconductor layer which is formed of a mixed crystal that consists of III-V compounds of InAs and GaAs and expressed by $In_xGa_{1-x}As$ where composition x is basically 0.53 which gives InP lattice matching and may at need vary from 0.4 to 0.7, that is, $0.4 \leq x \leq 0.7$.

Mention is next made of an example of high-frequency characteristics of the bipolar transistor according to the present invention.

Calculation Example 1

As the bipolar transistor 1 of the present invention, an InP heterojunction bipolar transistor 1, in which the semi-insulating substrate 2 was formed of InP, the subcollector layer 3 of two layers: n-type InP and InGaAs layers, the collector layers 4 and 5 of InP and InGaAs layers not incorporating any intentional impurity, the base layer 6 of InGaAs of p type, the emitter layer 7 of n type InP, and the contact layer 8 of $n^+$ InGaAs, had various characteristics calculated with the parameters as follows:

size of emitter layer: emitter width $W_E$=0.1 μm and emitter length $L_E$=2 μm;

thickness of base layer: 30 nm;

thickness of collector layer: 150 nm;

size of insulator ($SiO_2$) layer: width of 200 nm and height of 200 nm; and dielectric constant of InP=12.4 and dielectric constant of $SiO_2$=3.9.

Using these parameters, the characteristics of the InP heterojunction bipolar transistor 1 were calculated as stated below.

That is: its capacitance $C_{BC}$ between the collector and the base was 0.33 fF (where 1 fF=$10^{-15}$ F) and its cut-off frequency $f_T$ at which the current gain with the common emitter configuration became 1 was 517 GHz. And, its maximum oscillation frequency $f_{MAX}$ at which the power gain with the common emitter configuration became 1 was 820 GHz.

As a Comparative Example, calculation was made of a conventional bipolar transistor without any buried insulating layer.

An InP heterojunction bipolar transistor, in which the semi-insulating substrate 2 was formed of InP, the subcollector layer 3 of two layers: n-type InP and InGaAs layers, the collector layers 4 and 5 of InP and InGaAs layers not incorporating any intentional impurity, the base layer 6 of InGaAs of p type, the emitter layer 7 of n type InP, and the contact layer 8 of of $n^+$ InGaAs, had various characteristics calculated with the parameters as follows:

size of emitter layer: emitter width $W_E$=0.1 μm and emitter length $L_E$=2 μm;

thickness of base layer: 30 nm;

thickness of collector layer: 150 nm;

there being no insulator layer; and dielectric constant of InP=12.4.

The heterojunction bipolar transistor of this Comparative Example had its $C_{BC}$ of 1.10 fF, $f_T$ of 472 GHz and $f_{MAX}$ of 519 GHz.

It is thus shown by these calculation examples that the $C_{BC}$ of the heterojunction bipolar transistor 1 according to the present invention amounts to 30% of that in Comparative Example and its collector parasitic capacitance is markedly reduced. And, it is shown that the $f_T$ is about 1.2 times higher than of and the $f_{MAX}$ is about 1.6 time higher than of Comparative Example and that the heterojunction bipolar transistor of the present invention has markedly improved frequency characteristics.

A process of manufacturing a bipolar transistor 1 according to the present invention will be mention next.

Figure 3:
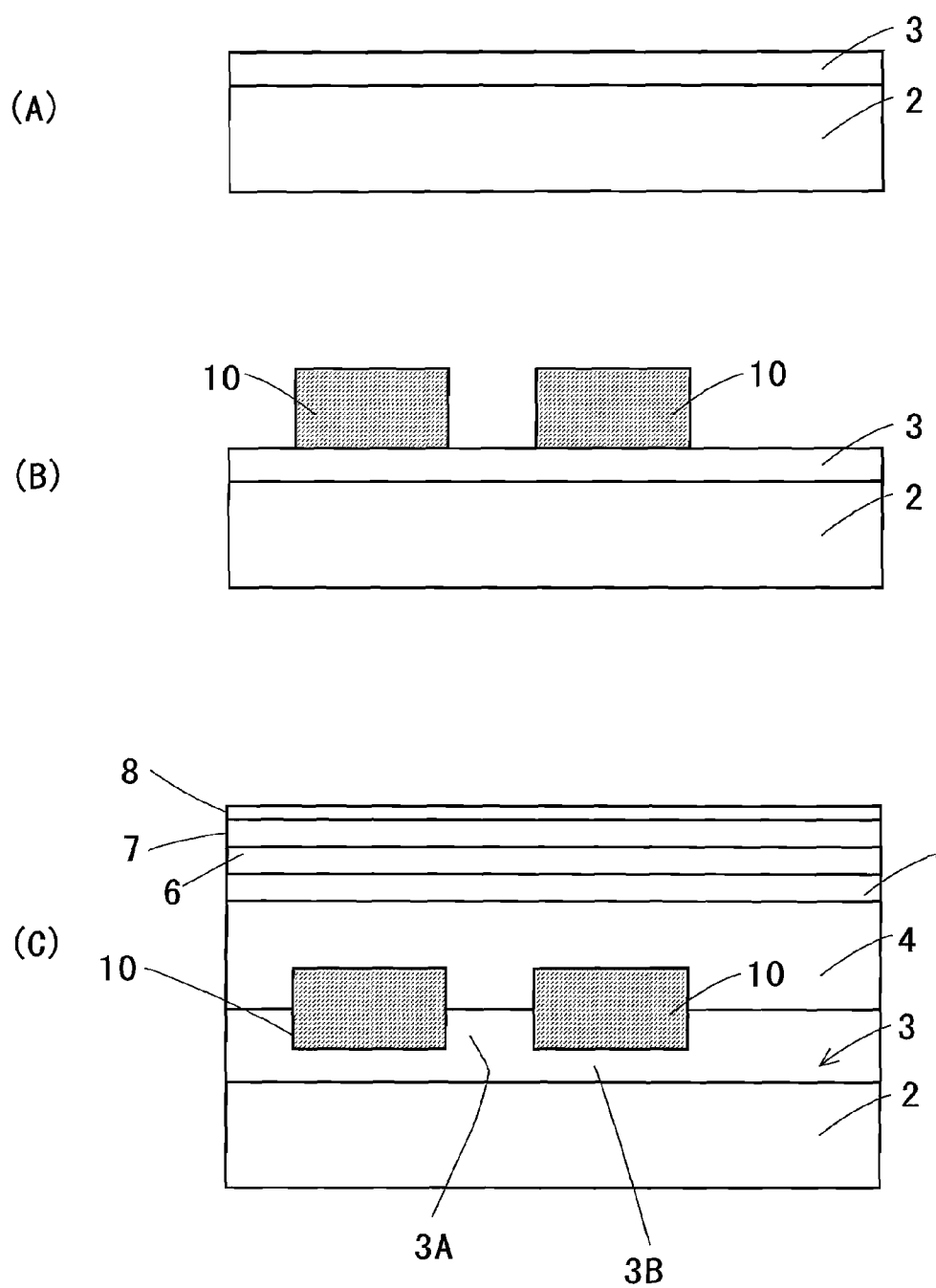
FIG. 3 illustrates in cross section the fore step in a process of manufacturing a bipolar transistor of the present invention.
Figure 4:
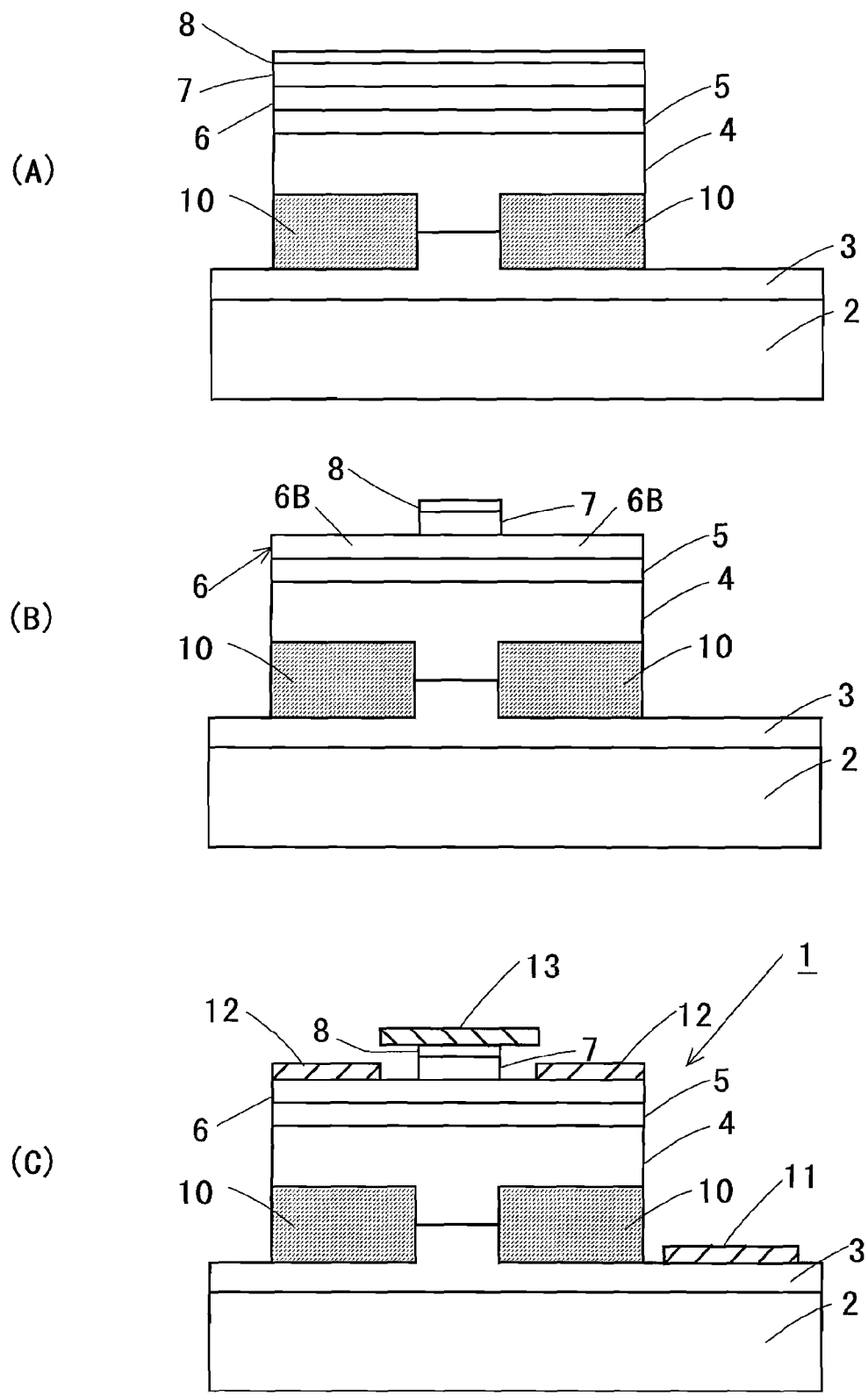
FIG. 4 illustrates in cross section the latter step in the process of manufacturing the bipolar transistor of the present invention.
Figure 6:
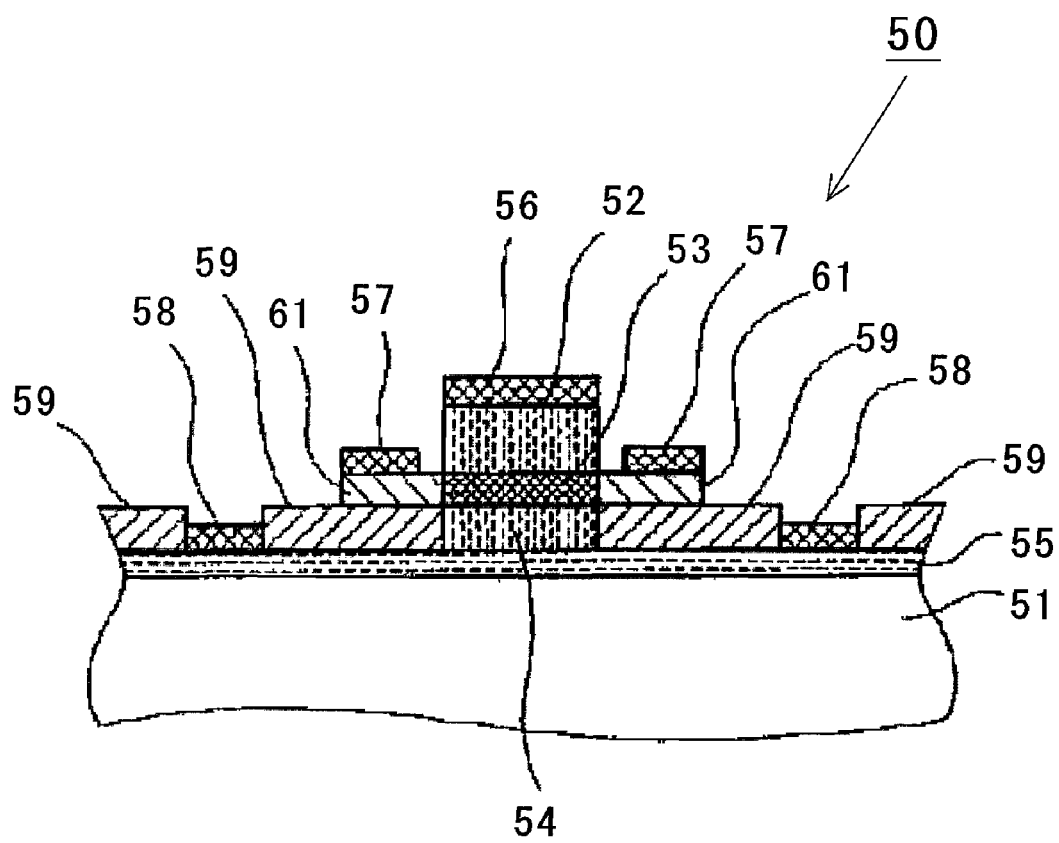
FIG. 6 is a cross-sectional view diagrammatically illustrating the structure of a conventional bipolar transistor.

FIGS. 3 and 4 are cross-sectional views diagrammatically illustrating the process of manufacturing a bipolar transistor 1 in accordance with the present invention.

At the outset, as shown in FIG. 3(A) a subcollector layer 3 is formed on a semi-insulating substrate 2 as a semiconductor substrate. In forming the subcollector layer 3, ion implantation or one of a variety of epitaxial growth methods that include metalorganic vapor-phase epitaxy and molecular beam epitaxy may be used.

Next, as shown in FIG. 3(B) only a region which becomes an extrinsic collector layer 4B of the intrinsic bipolar transistor in the subcollector layer is selectively formed with a fine wire structure made of the insulator layer 10. The insulator layer 10 is formed onto a whole surface of the subcollector layer by such as CVD and then removing its unnecessary portions by an etching method using a mask.

Next, as shown in FIG. 3(C) the epitaxial layers are grown by using such as metalorganic vapor-phase epitaxy etc. over a whole surface of the subcollector layer and the insulator layer that remain to grow a projecting subcollector layer 3A, collector layers 4 and 5, a base layer 6, an emitter layer 7 and an emitter contact layer 8 one after another. The key to the process of manufacturing the bipolar transistor 1 in accordance with the present invention resides in growing the collector layer while flattening therewith a region of projection and recesses formed of the insulator layer 10 and the subcollector layer 3 and then growing the collector layer 5, the base layer 6 and the emitter layer 7 and, at need, the emitter contact layer 8 on the flattened collector layer 4. The process of burying such insulator layer 10 of fine wire structure allows growing the intrinsic base layer 6A and the extrinsic base layer 6B as a single layer of a single crystal.

Next, as shown in FIG. 4(A) mesa etching to remove unnecessary portions of the epitaxially grown layers above except the intrinsic and external transistors is performed until the subcollector layer 3 is exposed. This mesa etching may be processed using chemical etching or dry etching or a combination of them.

Next, as shown in FIG. 4(B) unnecessary portions other than the intrinsic emitter layer 1 are etched to expose the extrinsic base layer 6B. This etching can be performed using chemical etching or dry etching or a combination of them.

And, as shown in FIG. 4(C) a collector electrode 11, a base electrode 12 and an emitter electrode 13 are formed on the subcollector layer 3, the extrinsic base layer 6B and the emitter contact layer 8, respectively. To form each of metal layers becoming these electrodes 11, 12 and 13, the method of electron beam evaporation or sputtering may be used. The electrodes may be patterned by one of a variety of etching methods using a mask.

Example

Mention is made of the present invention in further detail in respect to a specific example thereof as follows:

As an Example, a heterojunction bipolar transistor of InP was prepared.

First, a subcollector layer 3 of 600 nm thickness was formed on a semi-insulating substrate 2 of InP using the metalorganic vapor-phase epitaxy.

Next, a $SiO_2$ film of 60 nm thickness was deposited on the whole surface by the plasma assisted CVD method and after an electron beam resist film was applied thereto, only areas of 140 nm width where thin wires are to be formed becoming the insulator layer are exposed. The wire forming areas are longitudinally oriented in <010> crystallographic direction with respect to the substrate surface in (100) plane of the InP semi-insulating substrate 2.

Next, by the so-called lift-off process, namely by: upon vapor deposition of a thin film of aluminum entirely on the electron beam resist film with the wire forming areas opened, removing the electron beam resist film, thin wire-like aluminum films were formed. The thin wire-like aluminum films were masked, and in conformity with the aluminum film the $SiO_2$ film was etched by $CF_4$ dry etching. Finally, only the aluminum was removed with an aqueous solution of phosphoric acid to form thin $SiO_2$ wires becoming the insulator layer 10.

Subsequently, the epitaxial growth by the metalorganic vapor-phase epitaxy was carried out. Specifically, an n-InGaAs layer 3 becoming the subcollector layer of 10 nm thickness and of an impurity density in the order of $10^{19}$ cm$^3$ and an InP layer becoming the collector layer 4 of 150 nm thickness and without impurity added were grown at a growth temperature of 580° C.

Then, the growth temperature was lowered to 530° C. to grow one after another, an InGaAs layer 5 becoming the collector layer of 50 nm thickness and without impurity added, a p-InGaAs layer becoming the base layer 6 of 30 nm thickness and with an impurity density in the order of $10^{19}$ cm$^3$, an n-InP layer becoming the emitter layer 7 of 30 nm thickness and with an impurity density in the order of $10^{18}$ cm$^3$ and an emitter contact layer 8 consisting of n-InP and n-InGaAs layers of 10 nm thickness and with an impurity density in the order of $10^{19}$ cm$^3$ were grown in order.

FIG. 5 illustrates in cross section a semi-insulating substrate immediately after its epitaxial growth in the process of manufacturing in Example wherein (A) is a scanning electron microscopic image and (B) is an explanatory diagrammatic view thereof.

As is apparent from the Figure, it is seen that insulating layer 10 formed of $SiO_2$ and having a width of 140 nm and a thickness of 60 nm are buried in a semiconductor layer 15 epitaxially grown on the semi-insulating substrate 2 and that the semiconductor layer 15 has a flat surface. In this case, the epitaxially grown semiconductor layer 15 could be flattened when a deviation of the longitudinal direction of the insulator layer 10 of $SiO_2$ from the crystallographic <010> direction that is perpendicular to the plane of FIG. 5 is ±5. Conversely, when the longitudinal direction of the insulator layer 10 of $SiO_2$ was deviated more than 5° from the <010> crystallographic direction, then the semiconductor layer 15 could not be obtained as flat but had a surface irregularity due to the crystallographic anisotropy.

In the epitaxial growth, it has been found that the flatness of the semiconductor layer 15 is affected by the growth temperature, too, and good flatness is obtained at a growth temperature of 500 to 650° C., preferably 550 to 600° C. If the epitaxial growth temperature is higher than 650° C., then the semiconductor layer 15 undesirably becomes irregular in surface flatness due to the crystallographic anisotropy. Conversely, if the epitaxial growth temperature is lower than 500° C., then the source gas is not fully decomposed, undesirably giving rise again to the semiconductor layer 15 irregular in surface flatness.

Next, a metal becoming the emitter electrode was deposited by vapor deposition on the uppermost surface of the growth layers formed on the semi-insulating substrate 2 to form the emitter electrode 13 by electron beam lithography.

Further, the emitter electrode 13 was used as a mask, and dry etching and wet etching were combined to expose an extrinsic base surface. Then, metal becoming the base electrode is deposited thereon by vapor deposition to form the base electrode 12.

And, a region of the intrinsic transistor 1A and the base electrode 12 were masked so as to be coated with an electron beam resist and then were subjected to dry etching and wet etching until the collector contact layer 3 is exposed to deposit metal becoming the collector electrode thereon, thereby forming the collector electrode 11.

Finally, so that a number of such transistors formed on the semi-insulating substrate 2 were isolated from one another, the subcollector layers between the transistors were removed and each of the electrodes was formed with a wiring or the so-called pad, thereby fabricating heterojunction bipolar transistors 1 of the Example. A pad from each electrode may be formed using, e.g. the structure that the wiring is floated in the air, namely the so-called air bridge structure.

It should be understood that the present invention is not limited to the specific forms of implementation described above but allows various modifications thereof within its scope as set forth in the Claims. The bipolar transistor of the present invention is not limited to those having structures and with numerical values such as of parameters described above in the calculation example and specific example of the bipolar transistor but allows various alterations which are, needless to say, within that scope of the invention as far as they exhibit the effect of significantly improving their cut-off frequency and maximum oscillation frequency characteristics.

What is claimed is:

1. A bipolar transistor having a subcollector layer, a collector layer, a base layer and an emitter layer, characterized in that:
    said subcollector layer is formed with a projection and recesses;
    said collector layer provided above an upper part of said projection of said subcollector is constituted as an intrinsic collector layer of the bipolar transistor;
    said collector layer provided above an upper part of said recesses of said subcollector is constituted as an extrinsic collector layer of the bipolar transistor;
    an insulator layer is buried between the recesses of said subcollector layer and said extrinsic collector layer;
    a boundary interface between said projection of said subcollector layer and said intrinsic collector layer is sandwiched between said insulator layer;
    said base layer is comprising of an intrinsic base layer and an extrinsic base layer, and is formed of a single crystal layer;
    a base electrode is provided on said external base layer of said base layer; and
    said subcollector layer is provided with a collector electrode.

2. The bipolar transistor as set forth in claim 1, characterized in that said bipolar transistor is a heterojunction bipolar transistor.

3. The bipolar transistor as set forth in claim 2, characterized in that said heterojunction bipolar transistor comprises a hetero junction constituted by InP and $In_xGa_{1-x}As$ where $0.4 \leq x \leq 0.7$.

4. The bipolar transistor as set forth in any one of claims 1 to 3, characterized in that said bipolar transistor is formed on a semi-insulating substrate.

5. The bipolar transistor as set forth in claim 1, characterized in that said base electrode is provided above said insulator layer.

6. The bipolar transistor as set forth in claim 1, characterized in that a thickness of said insulator layer is thicker than that of a step of said recesses of said subcollector layer.

7. The bipolar transistor as set forth in claim 5, characterized in that said insulator layer is made of $SiO_2$.

* * * * *